US007310745B2

(12) United States Patent
Schnapp et al.

(10) Patent No.: US 7,310,745 B2
(45) Date of Patent: Dec. 18, 2007

(54) EFFICIENT MEDIA SCAN OPERATIONS FOR STORAGE SYSTEMS

(75) Inventors: Michael Gordon Schnapp, Taipei Hsien (TW); Chih-Chung Chan, Taipei Hsien (TW); Ching-Hai Hung, Taipei Hsien (TW)

(73) Assignee: Infortrend Technology, Inc., Chung-Ho, Taipei Hsien (TW)

( * ) Notice: Subject to any disclaimer, the term of this patent is extended or adjusted under 35 U.S.C. 154(b) by 309 days.

(21) Appl. No.: 10/907,311

(22) Filed: Mar. 29, 2005

(65) Prior Publication Data

US 2005/0240804 A1    Oct. 27, 2005

Related U.S. Application Data

(60) Provisional application No. 60/521,307, filed on Mar. 30, 2004.

(51) Int. Cl.
  *G06F 11/00* (2006.01)
(52) U.S. Cl. .............................. 714/8; 714/5
(58) Field of Classification Search ............. 714/8, 714/7, 5, 725, 718, 42, 54
  See application file for complete search history.

(56) References Cited

U.S. PATENT DOCUMENTS 5,311,520 A * 5/1994 Raghavachari .............. 714/723
5,666,458 A * 9/1997 Moon et al. ................... 386/2
5,740,028 A * 4/1998 Sugiyama et al. .......... 725/149
6,367,049 B1 * 4/2002 Van Dijk et al. ........... 714/761
6,745,308 B2 * 6/2004 Frank et al. ................ 711/169
2002/0156987 A1 * 10/2002 Gajjar et al. ............... 711/203
2006/0041656 A1 * 2/2006 Li et al. ..................... 709/223

* cited by examiner

*Primary Examiner*—Dieu-Minh Le
(74) *Attorney, Agent, or Firm*—Winston Hsu

(57) ABSTRACT

A method for media scan operations for storage system is disclosed. The method comprises the steps of arranging a range of sections of media of PSDs to perform media scan operations; scheduling the media scan operations; selecting a section in the range; verifying media of the selected section; determining the status of selected section; if the status is not ok, responding by proceeding with the corrective action processes, otherwise responding by selecting another section in the range to proceed with the verifying step, the determining step, and this responding step, until no more sections in the range to be verified. A storage subsystem implementing the method, a computer system comprising such storage subsystem, and a storage media having machine-executable codes stored therein for performing the method are also disclosed.

33 Claims, 5 Drawing Sheets

EFFICIENT MEDIA SCAN OPERATIONS FOR STORAGE SYSTEMS

CROSS REFERENCE TO RELATED APPLICATIONS

This application claims priority of application Ser. No. 60/521,307, filed on 2004 Mar. 30, and entitled "EFFICIENT MEDIA SCAN OPERATIONS FOR STORAGE SYSTEMS," which application is incorporated herein by reference.

BACKGROUND OF INVENTION

1. Field of the Invention

The present invention is related to a method for performing media scan operation for storage system and a storage subsystem and a storage system implementing the method.

2. Description of the Prior Art

Scanning media for defects or problem areas is a relatively common procedure. Most PC operating systems incorporate it as part of the process of preparing a section of media for accommodating data. Storage virtualization systems also commonly offer a way of scanning media for defects or problem areas prior to or during the process of preparing a section of physical media for use. It has also appeared on storage virtualization systems run on on-line media to detect defective media section of a PSD (physical storage device) while the data in that section can still be recovered or damage due to associated loss of data minimized. Storage virtualization systems have typically relied on a RAID parity consistency check operation performed on a RAID disk array to achieve this goal. This operation typically would include a mechanism for re-writing and/or reassigning a section of media that was not read successfully due to potentially defective media. Such an operation, however, suffers from the shortcoming that it is very resource intensive, causing a significant negative impact on normal host IO performance. This is because it requires transferring data in from each member disk in the disk array and then requires computing the XOR parity of all the data read in. Furthermore, it is only applicable to disk arrays that are redundant, that is either incorporate RAID parity (e.g., RAID levels 3, 4, 5) or incorporate mirroring (e.g., RAID 1). It cannot be used on disk arrays that are not redundant, such as simple striped arrays (e.g., RAID 0), nor can it be used on drives that are not members of an array.

One of the primary functions of the above-mentioned Storage Virtualization Systems (SVSs) is to protect integrity of, while allowing for continued access to, data stored within even in the face of certain kinds of faults. As an example, SVSs supporting some form of redundant array of disk drives allow a single disk drive to fail without loss of data or even loss of access to data stored in the array. However, there are still fault conditions that may cause loss of data itself and/or loss of data access. Such conditions typically consist of multiple faults in a certain set of associated devices, such as faults on two distinct disk drives in a redundant disk array. Applying techniques expressly designed to detect possible sources of faults then taking corrective action before the fault actually occurs can serve to minimize the possibility of such an occurrence.

One common cause of multiple faults in the set of member drives comprising a disk array is media errors on physical storage devices (PSDs). If a redundant disk array is running in an "optimal" state, media errors can typically be corrected "on-the-fly" without loss of data or loss of access to data. However, if the redundant disk array is operating in a "degraded" state, meaning that it is lacking in some or all redundancy due to the absence or failure of one or more member drives, then yet another fault may lead to such a loss. To avoid such an undesirable occurrence, preventative measures can be taken to reduce the likelihood that such a fault might occur while the disk array is operating in a "degraded" state.

Accordingly, there is a need for a method to solve the above-mentioned problems of the existing technologies.

SUMMARY OF INVENTION

An objective of the present invention is to provide an efficient media scan method by which problem areas of physical media in a data storage system can be detected early on so that appropriate counter-measures can be taken while affected data is still recoverable or damage due to associated loss of data can be minimized.

An further objective of the present invention is to provide a method to lower the possibility that a fault might occur while the redundant array is operated in a degraded state or the array does not have the ability to recover the data in a damaged media section A still further objective of the present invention is to provide a data storage subsystem and a data storage system incorporated with the above-mentioned media scan method.

Accordance to an embodiment of the invention, a method for media scan operations for storage system is provided. The method comprises the steps of: arranging a range of sections of media of PSDs to perform media scan operations; scheduling the media scan operations; selecting a section in the range; verifying media of the selected section; determining the status of the selected section to be ok or not ok; and, if the status is not ok, responding by proceeding with the corrective action processes, and, if the status is ok, responding by selecting another section in the range to proceed with the verifying step, the determining step, and this responding step, until there is no more section in the range to be verified.

Accordance to another embodiment of the invention, a storage virtualization subsystem is provided in which a media scan mechanism is implemented therein to perform the above-mentioned method.

Accordance to a further embodiment of the invention, a computer system having a storage virtualization subsystem is provided in which a media scan mechanism is implemented therein to perform the above-mentioned method.

These and various other features and advantages which characterize the present invention will be described in the detailed description.

BRIEF DESCRIPTION OF DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION

Brief Introduction to Storage Virtualization

Figure 1:
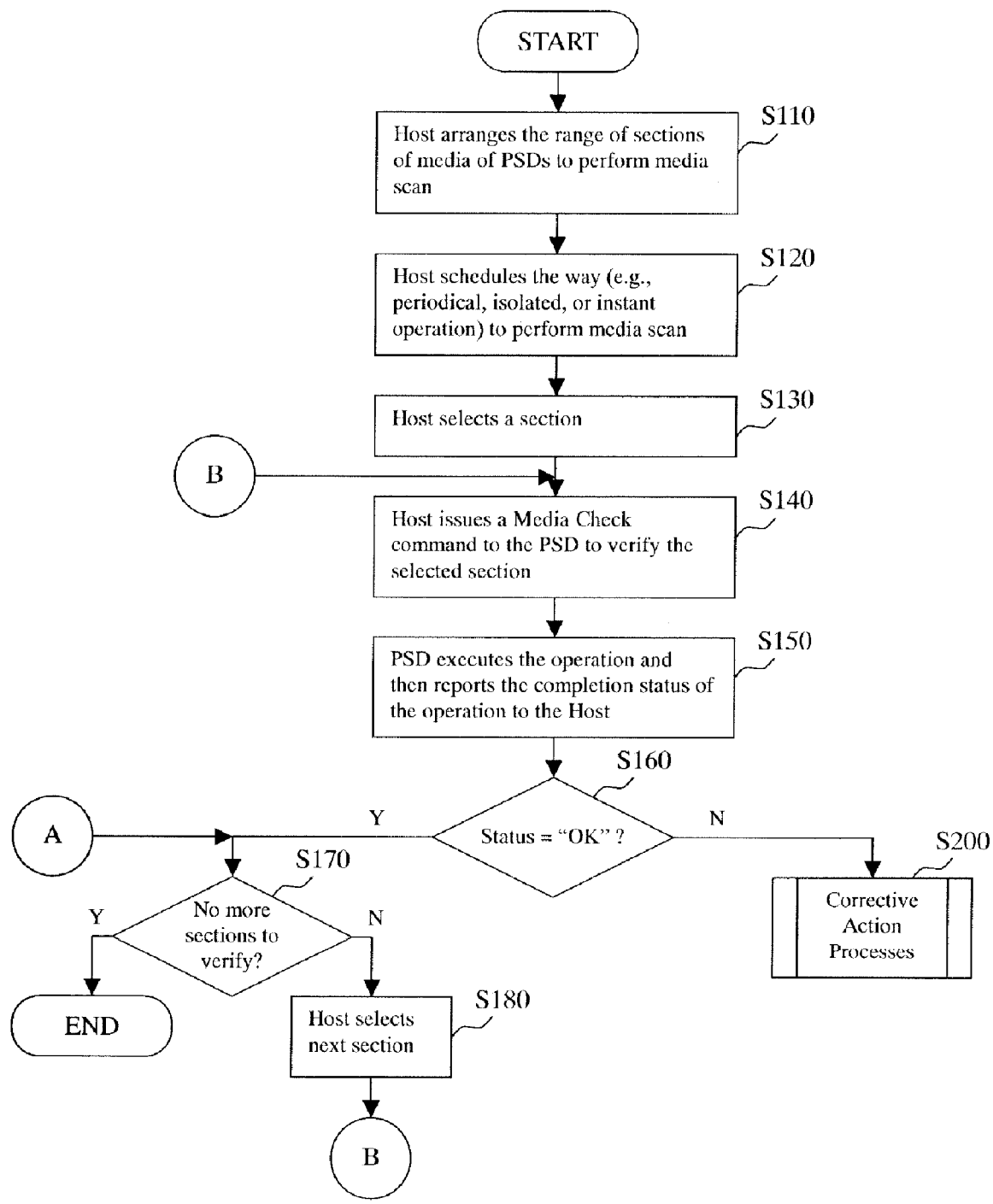
FIG. 1 is a flowchart illustrating an embodiment of processes for performing media scan operation for storage system according to the present invention.

Storage virtualization is a technology that has been used to virtualize physical storage by combining sections of physical storage devices (PSDs) into logical storage entities, herein referred to as logical media units (LMUs), that are made accessible to a host system. This technology has been used primarily in redundant arrays of independent disks (RAID) storage virtualization, which combines smaller physical storage devices into larger, fault tolerant, higher performance logical media units via RAID technology.

A Storage virtualization Controller, abbreviated SVC, is a device the primary purpose of which is to map combinations of sections of physical storage media to logical media units visible to a host system. IO requests received from the host system are parsed and interpreted and associated operations and data are translated into physical storage device IO requests. This process may be indirect with operations cached, delayed (e.g., write-back), anticipated (read-ahead), grouped, etc., to improve performance and other operational characteristics so that a host IO request may not necessarily result directly in physical storage device IO requests in a one-to-one fashion.

An External (sometimes referred to as "Stand-alone") Storage Virtualization Controller is a Storage Virtualization Controller that connects to the host system via an IO interface and that is capable of supporting connection to devices that reside external to the host system and, in general, operates independently of the host.

One example of an external Storage Virtualization Controller is an external, or stand-alone, direct-access RAID controller. A RAID controller combines sections on one or multiple physical direct access storage devices (DASDs), the combination of which is determined by the nature of a particular RAID level, to form logical media units that are contiguously addressable by a host system to which the logical media unit is made available. A single RAID controller will typically support multiple RAID levels so that different logical media units may consist of sections of DASDs combined in different ways by virtue of the different RAID levels that characterize the different units.

Another example of an external Storage Virtualization Controller is a JBOD emulation controller. A JBOD, short for "Just a Bunch of Drives", is a set of physical DASDs that connect directly to a host system via one or more a multiple-device IO device interconnect channels. DASDs that implement point-to-point IO device interconnects to connect to the host system (e.g., Parallel ATA HDDs, Serial ATA HDDs, etc.) cannot be directly combined to form a "JBOD" system as defined above for they do not allow the connection of multiple devices directly to the IO device channel. An intelligent "JBOD emulation" device can be used to emulate multiple multiple-device IO device interconnect DASDs by mapping IO requests to physical DASDs that connect to the JBOD emulation device individually via the point-to-point IO-device interconnection channels.

Another example of an external Storage Virtualization Controller is a controller for an external tape backup subsystem.

The primary function of a storage virtualization controller, abbreviated as SVC, is to manage, combine, and manipulate physical storage devices in such a way as to present them as a set of logical media units to the host. Each LMU is presented to the host as if it were a directly-connected physical storage device (PSD) of which the LMU is supposed to be the logical equivalent. In order to accomplish this, IO requests sent out by the host to be processed by the SVC that will normally generate certain behavior in an equivalent PSD also generate logically equivalent behavior on the part of the SVC in relation to the addressed logical media unit. The result is that the host "thinks" it is directly connected to and communicating with a PSD when in actuality the host is connected to a SVC that is simply emulating the behavior of the PSD of which the addressed logical media unit is the logical equivalent.

Storage virtualization subsystem may provide storage virtualization to hosts connected via standard host-storage interfaces using a pair of Storage Virtualization controllers configured redundantly so that a controller will takeover all the operations originally performed by the alternate controller should it malfunction.

Please also refer to the US Provisional Application "EFFICIENT MEDIA SCAN OPERATIONS FOR STORAGE SYSTEMS", Ser. No. 60/521,307, filed on 2004 Mar. 30, which is the priority basis application of the present application. The operation flows and structure pertaining to such SVSs and SVCs are explained in detail in the Attachment 1 entitled "Serial ATA External Storage Virtualization Controller and Subsystem" and Attachment 2 entitled "Redundant Serial ATA External Storage Virtualization Subsystem" of the US Provisional Application.

Embodiments of the Present Invention

An embodiment according to the present invention is started from description of the media scan operation on a particular PSD. The entire media scan operation on a particular PSD consists of a series of elemental operations on individual sections of physical media, one for each section of media. Typically, these elemental operations would be executed on physical media sections in a sequential fashion to minimize the performance impact caused by mechanical characteristics of the PSD (e.g., magnetic head seek, rotational latency, etc). However, orders other than a sequential fashion can also be adopted in the present invention. A typical elemental operation would consist of issuing a "Media Check" command to the PSD that would have the PSD perform a check of the state of the media and the data stored therein. On completion of command execution, if the PSD indicates that a problem was found with the state of the media or data stored therein, the Storage Virtualization Controller (SVC) would perform "corrective actions", that is, actions designed to recover the data or minimize the damage that could finally result from such a condition. The nature of such corrective actions would further depend on whether or not the offending section of media is a "data section", meaning that it has data that may need to be accessed at some point in the future stored on it, and, if so, whether or not the data stored therein is recoverable (e.g., PSD is a member of a redundant disk array that is currently in "optimal" state).

If the offending section is not a data section (a "non-data section"), then there are no concerns about the possibility that the data stored therein will be accessed at some point in the future, so the media section can be processed in a destructive way, meaning that media section and/or data stored therein can be freely manipulated without regard to the integrity of the data stored therein. The corrective action applied in this case, hereafter referred to as "Data-Destructive corrective action", would typically involve executing a write to the media section to force a rewriting of data and regeneration of check data by the PSD followed by a "Media Check" operation to check if the media problem has been corrected. If the problem still exists as evidenced by a failed Media Check operation, then an attempt to map out the offending media section and map in a replacement section (this operation hereafter referred to as a "Media Section Reassignment") would typically be performed. Alternately, the Media Section Reassignment could be executed directly without first attempting to correct the problem with a media write if it is deemed that the media section might not be reliable enough to store data as is.

If the offending section is a data section, and data stored therein is stored, in some form, redundantly such that it can be regenerated using data from other media sections on the same or other PSDs, then a process that allows for full recovery of data can be implemented. This would typically involve regenerating the data and then executing a write operation to the media section to write the regenerated data to the offending media section and, at the same time, force regeneration of check data by the PSD, followed by a Media Check operation to check if the media problem has been corrected. If the problem still exists as evidenced by a failed Media Check operation, then a Media Section Reassignment would typically be performed followed by another attempt to write the regenerated data to the media section and a Media Check operation to check if media problem still exists. Alternately, a Media Section Reassignment could be performed before the attempt to write the regenerated data if it is deemed that the media section might not be reliable enough to store data as is.

If the offending section is a data section, but data stored therein cannot be regenerated, then data recovery is not possible. In this case, it is important either that no "destructive operations" be performed on the media section or that, if destructive operations are to be performed, a non-volatile record be made indicating that the data stored in the offending media section is no longer valid (this operation hereafter referred to as "Marking the media section Bad"). In this way, future IO operations that, for instance, are generated as part of normal operation, can detect the problem and deal with it accordingly (e.g., return error status to requesting entity). If the implementation is such that destructive operations are not performed, typical corrective actions would consist of simply posting an event message to an event log and/or issuing a notification to inform the user that a condition worthy of attention has occurred. If the implementation is such that the offending media section is to be "Marked Bad" thereby allowing destructive operations to be performed as part of the corrective action, then a process similar to the corrective actions defined for media problems detected in non-data sections would typically be applied following the Marking Bad of the offending section.

In addition to the actual execution of the various Corrective Action processes discussed above, typically, selected steps in the processes would also generate related event messages logged to an event log and/or issue related notifications to keep the user informed as to what has transpired just in case it is deemed worthy of closer monitoring.

According to an embodiment of the present invention, the host entity (e.g., the SVC) arranges the range of sections of media of PSDs and schedules the media scan operation. The range can be one or some or all section of one or multiple PSDs. To schedule the media scan operation means the operation can be scheduled as periodical, isolated, or instant operation. After the arrangement and the scheduling are completed, the verification on the sections of media of PSDs can be started and the corrective actions can be performed, if necessary, according to data attribute of the sections, such as non-data section, data section that is currently in a state that permits regeneration of data therein, or, data section that is currently in a state that do not permit regeneration of data therein, etc.

According to an embodiment of the present invention, a typical procedure implementing the media scan operation on sets of media sections that are members of redundant combinations of media sections (e.g. member sections of redundant disk arrays such as RAID-1, RAID-3, RAID-5, and RAID-6 arrays) that are currently in a state that permit data regeneration might be as follows:

(1) A Media Check command is issued to the PSD to the state of a section of media and the data stored therein.

(2) The PSD executes the operation and then reports the completion status of the operation to the SVC. If the status is "OK", then the SVC moves on to scan the next media section and processing continues from (1).

(3) If the completion status of the operation is not "OK" ("not-ok") and the failure was a result of an error other than a media error (non-media error) then two possible approaches can be adopted depending on the implementation. The first is that the offending section can be considered to be "unrecoverable" and appropriate counter-measures taken followed by the continuation of processing with the next media section at (1). The second is that the entire media scan operation on the particular PSD can be aborted.

(4) Otherwise, the completion status of the operation is not "OK" and the failure was due to a media error. Data from corresponding sections on the same or other PSDs is read in and combined to regenerate the data on the section of media in which the Media Check operation failed.

(5) When the completion status of the operation is not "OK" and the failure was due to a media error, the procedure will evaluate whether or not the media error problem is "persistent". If it is determined that the problem is "persistent", a Media Section Reassignment operation can be performed on the offending section of media. One typical criterion to determine "persistency" is that simple rewriting of the data will not prevent problem recurrence in the same media section. Alternately, the criterion can be that all media errors are considered "persistent", and a Media Section Reassignment can be performed on all media sections for which the Media Check operation failed with a media error.

(6) If a Media Section Reassignment was performed and it failed or if the Media Section Reassignment should have been performed but could not for some other reason (e.g., because the maximum number of such reassignments that are allowed has been reached), then the offending section is considered to be "unrecoverable" and processing continues with the next media section at (1).

(7) If the media error is deemed not persistent, the regenerated data is then written to the offending section of media.

(8) The Media Check is reissued to the offending section of the PSD to verify the offending section of media again and procedure continues from (2).

According to an embodiment of the present invention, a typical procedure implementing the media scan operation on sets of media sections that are members of non-redundant combinations of media sections (e.g., non-redundant disk arrays such as RAID-0 arrays) or on sets of media sections that are members of redundant combinations of media sections but that are in a state that does not permit data regeneration might be as follows:

(1) A Media Check command is issued to the PSD to the state of a section of media and the data stored therein.

(2) The PSD executes the operation and then reports the completion status of the operation to the SVC. If the status is "OK", then the SVC moves on to scan the next media section and processing continues from (1).

(3) If the completion status of the operation is not "OK" and destructive operations on the media section are not supported (e.g., Marking a media section Bad is not implemented) or the failure was a result of an error other than a media error (non-media error) then two possible approaches can be adopted depending on the implementation. The first is that the offending section can be considered to be "unrecoverable" and appropriate counter-measures taken followed by the continuation of processing with the next media section at (1). The second is that the entire media scan operation on the particular PSD can be aborted.

(4) Otherwise, the completion status of the operation is not "OK", the failure was due to a media error and destructive operations on the media section are supported. In one preferred implementation, the offending media section will be marked bad so that future READ operations of that section can detect the fact that the data in the section may not be valid and take the appropriate counter-measures (e.g., return error status to the requesting entity).

(5) When the completion status of the operation is not "OK" and the failure was due to a media error, the procedure will evaluate whether or not the media error problem is "persistent". If it is determined that the problem is "persistent", a Media Section Reassignment operation can be performed on the offending section of media. One typical criterion to determine "persistency" is that simple rewriting of the data will not prevent problem recurrence in the same media section. Alternately, the criterion can be that all media errors are considered "persistent", and a Media Section Reassignment can be performed on all media sections for which the Media Check operation failed with a media error.

(6) If a Media Section Reassignment was performed and it failed or if the Media Section Reassignment should have been performed but could not for some other reason (e.g., because the maximum number of such reassignments that are allowed has been reached), then the offending section is considered to be "unrecoverable" and processing continues with the next media section at (1).

(7) In determining whether or not the media error is "persistent", the following measure can be taken. A physical media WRITE command is issued to the offending section of the PSD followed by a re-issuance of the Media Check command. Alternately, a single-command physical media WRITE-VERIFY command can be issued in place of the two-command WRITE followed by Media Check command sequence. Processing continues with (2).

According to an embodiment of the present invention, a typical implementing the media scan operation on sets of non-data media sections (e.g., spare or unassigned drives) might be as follows:

(1) A Media Check command is issued to the PSD to the state of a section of media and the data stored therein.

(2) The PSD executes the operation and then reports the completion status of the operation to the SVC. If the status is "OK", then the SVC moves on to scan the next media section and processing continues from (1).

(3) If the completion status of the operation is not "OK" and the failure was a result of an error other than a media error (non-media error) then the offending media section is considered to be "unrecoverable" and appropriate counter-measures can be taken. Processing continues with the next media section at (1).

(4) Otherwise, the completion status of the operation is not "OK" and the failure was due to a media error. The procedure will then evaluate whether or not the media error problem is "persistent". If it is determined that the problem is "persistent", a Media Section Reassignment operation can be performed on the offending section of media. One typical criterion to determine "persistency" is that simple rewriting of the data will not prevent problem recurrence in the same media section. Alternately, the criterion can be that all media errors are considered "persistent", and a Media Section Reassignment can be performed on all media sections for which the Media Check operation failed with a media error.

(5) If a Media Section Reassignment was performed and it failed or if the Media Section Reassignment should have been performed but could not for some other reason (e.g., because the maximum number of such reassignments that are allowed has been reached), then the offending section is considered to be "unrecoverable" and processing continues with the next media section at (1).

(6) In determining whether or not the media error is "persistent", the following measure can be taken. A physical media WRITE command is issued to the offending section of the PSD followed by a re-issuance of the Media Check command. Alternately, a single-command physical media WRITE-VERIFY command can be issued in place of the two-command WRITE followed by Media Check command sequence. Processing continues with (2).

In the procedures detailed above, when a failure of a Media Check operation on a media section results in the offending section being considered "unrecoverable", so-called "appropriate counter-measures" would typically consist of posting an event to the event log and, optionally, issuing a notification to inform the user that a condition worthy of his attention has occurred. For data drives, a replacement drive, could optionally be brought on line and data copied from the offending drive onto it, after which the offending drive could be taken off line being fully replaced by the replacement drive.

The drawing FIGS. 1 through 5 are main flows showing alternate embodiments in accordance with of the present invention.

Please refer to FIG. 1, which is a flowchart illustrating an embodiment of processes for performing media scan operation for storage system according to the present invention. The host entity (e.g., the SVC) arranges the range of sections of media of PSDs to perform media scan (step S110). The host then schedules the timing (step S120), such as periodical, isolated, or instant operation, to perform the media scan. When Host starts to perform the media scan operation, it selects a section (step S130) and issues a Media Check command to the associated PSD to verify the selected section (step S140). The PSD executes the check operations in response to the command and then reports the completion status of the operation to the Host (step S150). Now the process has to determine whether the status is "OK" or not (step S160). If the completion status is "OK", which reflects the fact that the selected section is OK, the Host entity will select another arranged section to perform Media Check operation until there is no more arranged section to verify. So, the process has to test if the selected section just verified is the last section and there is no more arranged section to check (step S170). If there is no more arranged section to verify, then the process is end. Otherwise, the Host entity will select another arranged section (step S180) for performing Media Check operation and the process proceeds to node B to go back to step S140 to perform the Media Check operation. If the completion status is "not-OK", the corrective action processes will begin (step S200).

Figure 2:
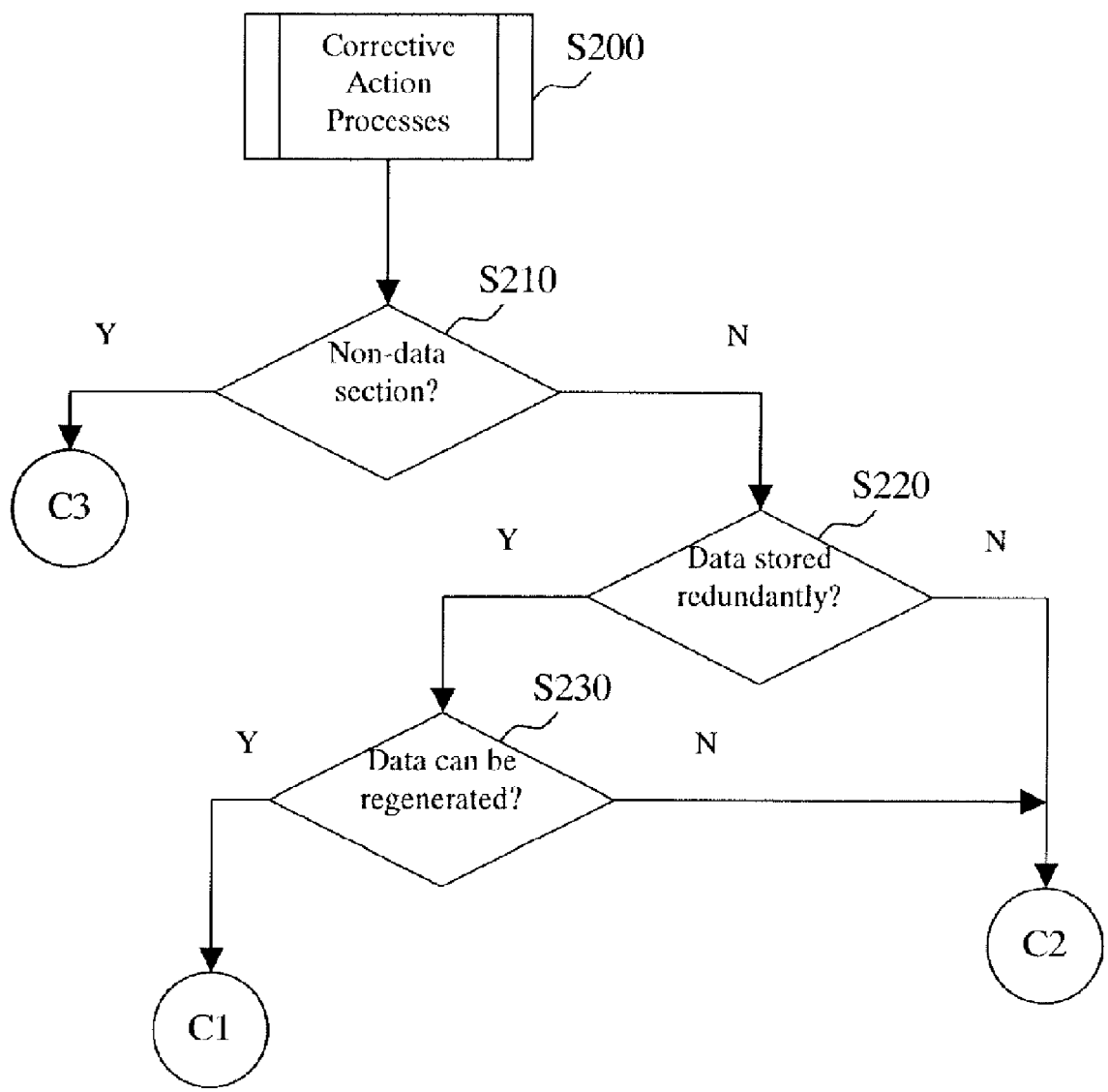
FIG. 2 is a flowchart illustrating an embodiment of the corrective action processes in FIG. 1 according to the present invention.

Please refer to FIG. 2, which is a flowchart illustrating of an embodiment of the corrective action processes in FIG. 1 according to the present invention. The corrective action processes start from testing whether the selected section is a non-data section in step S210. If it is, the process goes to node C3. Otherwise, the selected section is a data section, it goes to step S220 to test whether data in the selected section is stored redundantly. If the answer is "no" for S220, the process goes to node C2. If the answer is yes for S220, then it is further tested in step S230 that whether the data in the selected section can be regenerated. If the answer for S230 is "no", the process goes to node C2. If the answer for S230 is "yes", which means the data in the selected section can be regenerated, the process goes to node C1.

Figure 3:
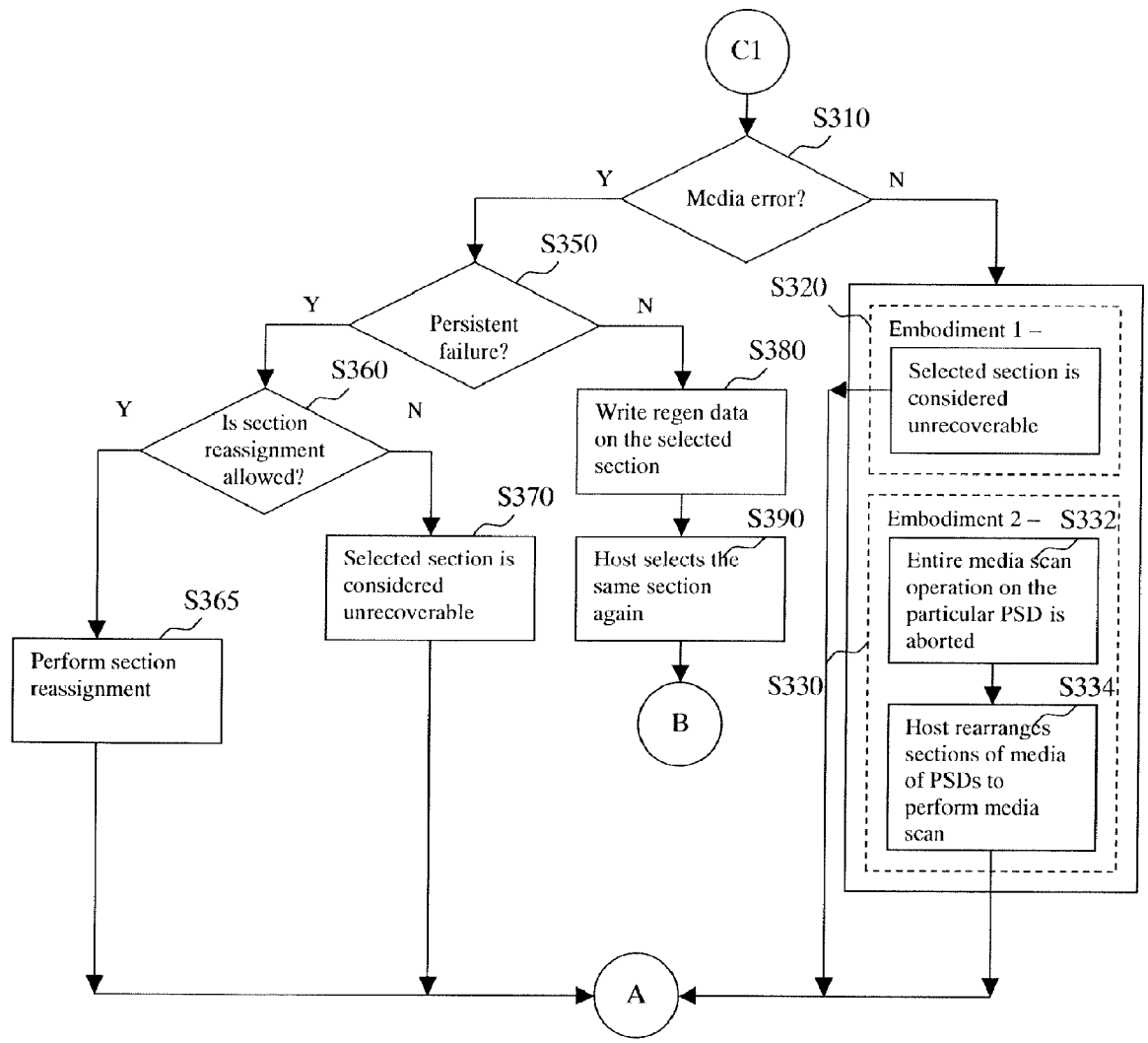
FIG. 3 is a flowchart illustrating an embodiment of the conditional branch C1 of the corrective action processes in FIG. 2.

Please refer to FIG. 3, which is a flowchart illustrating an embodiment of the conditional branch C1 of the corrective action processes in FIG. 2. Node C1 corresponds to the corrective action for a typical procedure implementing the media scan operation on sets of media sections that are members of redundant combinations of media sections (e.g. member sections of redundant disk arrays such as RAID-1, RAID-3, RAID-5, and RAID-6 arrays) that are currently in a state that permit data regeneration.

The process starts from step S310 to test if the not-OK status results from a media error. If the answer is "no" in S310, the process goes to step S320 or S330, either is possible approach and can be adopted depending on the implementation. In S320, the selected section is considered to be "unrecoverable" and appropriate counter-measures can be taken. In S330, the entire media scan operation on the particular PSD is aborted (step S332) and then the host rearranges the sections of median of PSDs to perform media scan (step S334). After S320 or S330 is finished, the process goes to node A.

If the answer is "yes" in S310, the process goes to step S350 to test if the media error causing the not-ok status is persistent. If the answer is "yes" in S350, the process goes to step S360 to test if the Media Section Reassignment is allowed. If the answer is "yes" in S360, Media Section Reassignment will be performed on the selected section (step S365), otherwise the selected section will be considered unrecoverable (step S370). After S365 or S370 is finished, the process goes to node A. At node A, process goes to step S170, which has been explained earlier with FIG. 2.

If the answer is "no" in S350, data will be regenerated and written on the selected section in step S380 and then this section will be selected again in step S390 so that the Media Check command is reissued to this same section again to verify it again in step S140.

Figure 4:
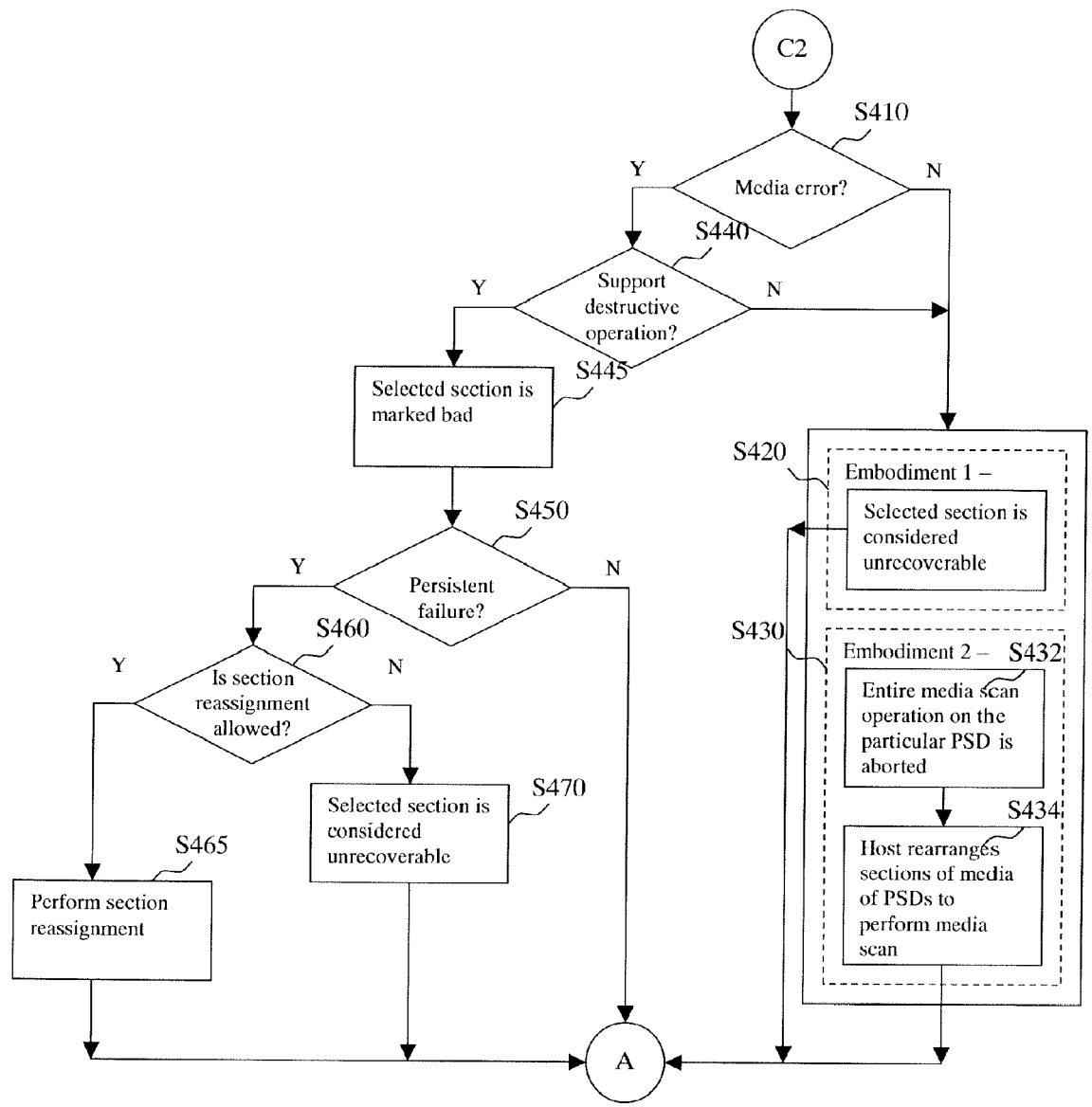
FIG. 4 is a flowchart illustrating an embodiment of the conditional branch C2 of the corrective action processes in FIG. 2.

Please refer to FIG. 4, which is a flowchart illustrating an embodiment of the conditional branch C2 of the corrective action processes in FIG. 2. Node C2 corresponds to the corrective action for a typical procedure implementing the media scan operation on sets of media sections that are members of non-redundant combinations of media sections (e.g., non-redundant disk arrays such as RAID-0 arrays) or on sets of media sections that are members of redundant combinations of media sections but in a state that does not permit data regeneration.

The process starts from step S410 to test if the not-OK status results from a media error. If the answer is "no" in S410, the process goes to step S420 or S430, either is possible approach and can be adopted depending on the implementation. If the answer is "yes" in S410, it is tested in step S440 if destructive operations on the media section are supported. If the answer is "no" in S440, the process still goes to step S420 or S430. In S420, the selected section is considered to be "unrecoverable" and appropriate counter-measures can be taken. In S430, the entire media scan operation on the particular PSD is aborted (step S432) and then the host rearranges the sections of median of PSDs to perform media scan (step S434). After S420 or S430 is finished, the process goes to node A.

If the answer is "yes" in S440, the selected section is marked bad in step S445 and the process goes to step S450 to test if the media error causing the not-ok status is persistent. If the answer is "yes" in S450, the process goes to step S460 to test if the Media Section Reassignment is allowed. If the answer is "yes" in S460, Media Section Reassignment will be performed on the selected section (step S465), otherwise the selected section will be considered unrecoverable (step S470). After S465 or S470 is finished, the process goes to node A. If the answer is "no" in S450, the process still goes to node A. At node A, process goes to step S170, as explained earlier with FIG. 2.

Figure 5:
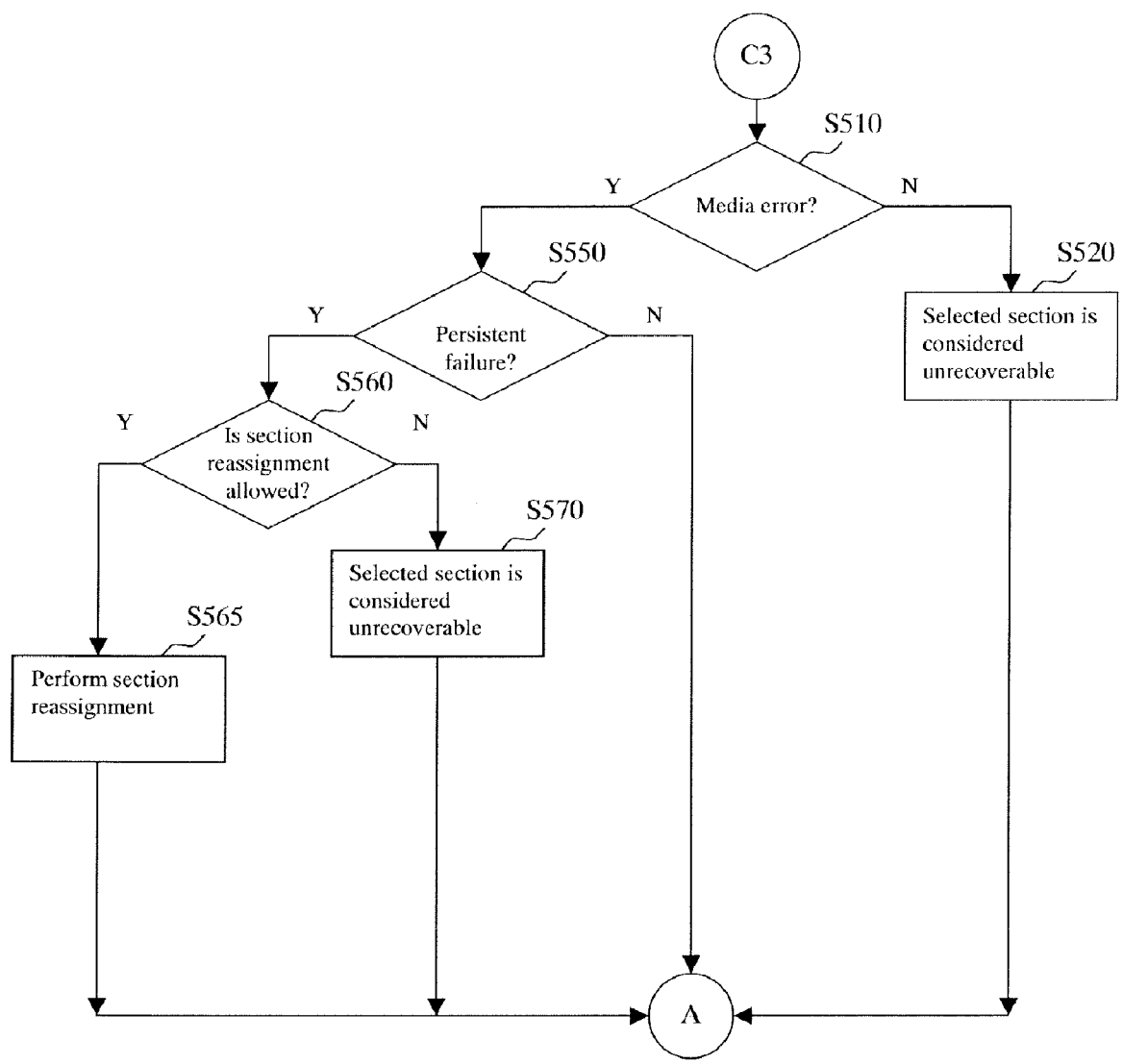
FIG. 5 is a flowchart illustrating an embodiment of the conditional branch C3 of the corrective action processes in FIG. 2.

Please refer to FIG. 5, which is a flowchart illustrating an embodiment of the conditional branch C1 of the corrective action processes in FIG. 2. Node C3 corresponds to the corrective action for a typical implementation of the media scan operation on sets of non-data media sections (e.g., spare or unassigned drives in the PSD array). The process starts from step S510 to test if the not-OK status results from a media error. If the answer is "no" in S510, the selected section is considered to be "unrecoverable" in step S520 and appropriate counter-measures can be taken. After S520 is finished, the process goes to node A.

If the answer is "yes" in S510, the process goes to step S550 to test if the media error causing the not-ok status is persistent. If the answer is "yes" in S550, the process goes to step S560 to test if the Media Section Reassignment is allowed. If the answer is "yes" in S560, Media Section Reassignment will be performed on the selected section (step S565), otherwise the selected section will be considered unrecoverable (step S570). After S565 or S570 is finished, the process goes to node A. If the answer is "no" in S550, the process still goes to node A. At node A, process goes to step S170, which has been explained earlier with FIG. 2.

Form the description above, it is noted that, the current invention endeavors to minimize the negative impact on performance of the media scan operation by reducing the resource requirements of the operation. The primary way this is accomplished is by eliminating the RAID parity computation until data recovery is required.

The current invention also seeks to reduce the negative performance impact by, wherever possible, issuing commands to the PSD that achieve the goal of checking the state of the media and the data stored therein, hereafter referred to as Media Check commands, while, at the same time will minimize resource consumption. The physical media VERIFY command is especially suited for such a task for it does not generate any data transfer to the host entity (the SVC in this case), but, rather, simply check the status of the media and the data stored therein. However, in implementations in which a PSD does not support such a command or a VERIFY command may actually consume more resources than commands that might involve data transfer or engage other functionality (e.g., standard READ command), then other commands can be used in place of the VERIFY command in the role of a Media Check command.

The current invention adds the ability to run media scan on any PSD, whether or not it is a member of a disk array or a drive storing data. This includes spare drives, both global and dedicated, and drives that have not yet been assigned. This serves the purpose of detecting potential problem media sections before data is stored to them and dealing with them in a preventative fashion.

The current invention also defines two possible modes of media scan operation. The first is off-line operation mode, meaning that the PSD on which the operation is being performed is not available for IO operations that are generated as part of normal operation. In this mode, the PSD is either already off line or taken off line if it is on line before performing the media scan operation and is kept off line for the course of the operation. The second is on-line operation mode, meaning that the SVC can still dispatch to the PSD IO operations generated as part of normal operation. In this mode, the operating state of the PSD needn't change in order to perform media scan operation. This mode is sometimes referred to as "background" mode, because the operation does not effect the normal operation of the SVC relative to the PSD.

The current invention also optionally adds functionality that allows setting up background media scan operations to run at user-specified times. This gives the user the ability to schedule such operations for periods when, for example, the system load is relatively low, thereby minimizing the impact of the lowered host IO performance caused by running the operation. Such a scheduling function would typically include the ability to establish schedules that repeat the execution of the media scan operation in a regular fashion (e.g., once every Saturday at midnight) as well as the ability to schedule isolated, or "one-shot", operation instances. In addition, a single instance background media scan operation immediately executed upon receiving of user instruction can also be performed.

The current invention also optionally specifies the media scan operation to be incorporated in SVCs and SVSs that support serial point-to-point drive-side IO device interconnects.

The current invention also optionally specifies the media scan operation to be incorporated in and run on SVSs that consist of a plurality of redundantly configured SVCs.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are embraced within the scope of the invention as defined in the appended claims.

What is claimed is:

1. A method for media scan operations for storage system, comprising the steps of:

arranging a range of sections of media of PSDs to perform media scan operations;
scheduling the media scan operations;
selecting a section in the range;
verifying media of the selected section;
determining the status of the selected section to be ok or not ok; and
responding by proceeding with a corrective action process if the status is not ok, and by, if the status is ok, selecting another section in the range to proceed with the verifying step, the determining step, and the responding step, until there is no more section in the range to be verified.

2. The method defined in claim 1, further comprising the step of determining whether or not the selected section of which the data can be regenerated when a media error occurs.

3. The method as defined in claim 1, further comprising the step of determining whether or not the selected section of which the data has associated redundant data stored in the storage system.

4. The method defined in claim 1, further comprising the step of determining whether or not the selected section is a non-data section.

5. The method defined in one of claims 1-4, wherein when the status of the selected section is determined to be not ok, further comprises the step of determining whether the not-ok status is resulted from a media error or a non-media error.

6. The method defined in claim 5, wherein when the status is resulted from a non-media error, the selected section is considered unrecoverable.

7. The method defined in claim 5, wherein when the status is resulted from a non-media error, a PSD containing the selected section is removed from the media scan operation range.

8. The method defined in claim 5, wherein when the status is resulted from a media error, further comprises the step of determining whether the media error is persistent or non-persistent.

9. The method defined in claim 5, wherein when the status is resulted from a media error, further comprises the step of determining whether or not section reassignment is to proceed.

10. The method defined in claim 5, wherein when the status is resulted from a media error, further comprises the step of performing section reassignment.

11. The method defined in claim 5, wherein when the status is resulted from a media error and when the selected section is not to perform section reassignment, further comprises the step of considering the selected section unrecoverable.

12. The method defined in claim 1, wherein when data in the selected section can be regenerated and the status is determined to a not-ok status resulted from a non-persistent media error, further comprises the step of regenerating and writing data on the selected section and selecting the selected section to verify again.

13. The method defined in claim 1, wherein when the status is determined a not-ok and data in the selected section can not be regenerated from data in the storage system, further comprises the step of marking the selected section bad data section.

14. The method defined in claim 1, wherein when the status is determined not-ok and the status is resulted from a media error and the error data can not be regenerated, further comprises the step of determine whether or not destructive corrective operation is to perform.

15. The method defined in claim 1, wherein when the status is determined not-ok and the status is resulted from a media error, further comprises the step of determining whether the media error is persistent or non-persistent by issuing a single-command physical media write-verify command to the PSD of the selected section.

16. The method defined in claim 1, wherein when the status is determined not-ok and the status is resulted from a non-media error, further comprises the step of rearranging the range of sections for the media scan operation.

17. The method defined in claim 1, wherein the method is operated in off-line mode.

18. The method defined in claim 1, wherein the method is operated in on-line mode.

19. The method defined in claim 1, wherein the media scan operations are scheduled to perform when the system load is relatively low.

20. The method defined in claim 1, wherein the method is performed in a SVS that supports point-to-point serial signal transmission in drive-side IO device interconnects.

21. The method defined in claim 1, wherein the method is performed in a SVS comprising SVCs redundantly configured therein.

22. The method defined in claim 1, further comprising the step of determining the data attribute of the selected section.

23. The method defined in claim 22, wherein the step of determining the data attribute of the selected section is performed after the step of determining the status of the selected section.

24. A storage virtualization subsystem (SVS) comprising:
   an array of PSDs each having data storage space for storing data therein;
   a controller coupled to the PSD array for executing IO operations in response to IO requests from a host entity to access the PSD array;
   wherein the controller is implemented with a media scan mechanism to perform the steps of:
   arranging a range of sections of media of PSDs to perform media scan operations;
   scheduling the media scan operations;
   selecting a section in the range;
   verifying media of the selected section;
   determining the status of the selected section to be ok or not ok; and
   responding by proceeding with a corrective action process if the status is not ok, and by, if the status is ok, selecting another section in the range to proceed with the verifying step, the determining step, and the responding step, until there is no more section in the range to be verified.

25. The subsystem defined in claim 24, wherein the media scan mechanism further comprises the step of: determining whether or not the selected section of which the data can be regenerated when a media error occurs.

26. The subsystem defined in claim 24, wherein the media scan mechanism further comprises the step of: determining whether or not the selected section of which the data has associated redundant data stored in the storage system.

27. The subsystem defined in claim 24, wherein the media scan mechanism further comprises the step of: determining whether or not the selected section is a non-data section.

28. The subsystem defined in claim 24, wherein the subsystem supports point-to-point serial signal transmission in drive-side IO device interconnects.

29. The subsystem defined in claim 24, wherein the subsystem comprises a plurality of the controllers and the controllers are configured to be redundant controllers.

30. A computer system comprising:
   a host computer;
   an array of PSDs each having data storage space for storing data therein;
   a storage virtualization controller coupled between the host computer and the PSD array for executing IO operations in response to IO requests from the host computer to access the PSD array;
   wherein the controller is implemented with a media scan mechanism to perform the steps of:
   arranging a range of sections of media of PSDs to perform media scan operations;
   scheduling the media scan operations;
   selecting a section in the range;
   verifying media of the selected section;
   determining the status of the selected section to be ok or not ok; and
   responding by proceeding with a corrective action process if the status is not ok, and by, if the status is ok, selecting another section in the range to proceed with the verifying step, the determining step, and the responding step, until there is no more section in the range to be verified.

31. The system defined in claim 30, wherein the media scan mechanism further comprises the step of: determining whether or not the selected section of which the data can be regenerated when a media error occurs.

32. The system defined in claim 30, wherein the media scan mechanism further comprises the step of: determining whether or not the selected section of which the data has associated redundant data stored in the storage system.

33. The system defined in claim 30, wherein the media scan mechanism further comprises the step of: determining whether or not the selected section is a non-data section.

* * * * *

UNITED STATES PATENT AND TRADEMARK OFFICE
CERTIFICATE OF CORRECTION

| | |
|---|---|
| PATENT NO. | : 7,310,745 B2 |
| APPLICATION NO. | : 10/907311 |
| DATED | : December 18, 2007 |
| INVENTOR(S) | : Michael Gordon Schnapp et al. |

It is certified that error appears in the above-identified patent and that said Letters Patent is hereby corrected as shown below:

On the Title Page, Item (73), Assignee, the name of the assignee should be corrected from "Infertrend Technology, Inc." to -- Infortrend Technology, Inc. --

Signed and Sealed this

Twenty-ninth Day of April, 2008

JON W. DUDAS
*Director of the United States Patent and Trademark Office*